United States Patent [19]
Redwine

[11] Patent Number: 5,321,291
[45] Date of Patent: Jun. 14, 1994

[54] POWER MOSFET TRANSISTOR

[75] Inventor: Donald J. Redwine, Houston, Tex.

[73] Assignee: Texas Instruments Incorporated, Dallas, Tex.

[21] Appl. No.: 68,731

[22] Filed: May 26, 1993

Related U.S. Application Data

[63] Continuation of Ser. No. 807,925, Dec. 16, 1991.

[51] Int. Cl.$^5$ .................... H01L 29/78; H01L 29/06
[52] U.S. Cl. .................... 257/341; 257/409; 257/488; 257/519; 257/544; 257/401
[58] Field of Search ............ 257/519, 544, 398, 401, 257/331, 341, 488, 409

[56] References Cited

U.S. PATENT DOCUMENTS

| | | | |
|---|---|---|---|
| 3,586,930 | 6/1971 | Das et al. | 257/341 |
| 4,058,822 | 11/1977 | Awane et al. | 257/401 |
| 4,288,802 | 9/1981 | Ronen | 257/341 |
| 5,144,389 | 9/1992 | Nakamura et al. | 257/409 |

OTHER PUBLICATIONS

"Threshold-Voltage Instability in MOSFET's Due to Channel Hot-Hole Emission", Richard B. Fair, Robert C. Sun, *IEEE Transactions on Electron Devices*, vol. ED-28, No. 1, Jan. 1981, pp. 83-94.

*Primary Examiner*—Jerome Jackson
*Attorney, Agent, or Firm*—Ira S. Matsil; James C. Kesterson; Richard L. Donaldson

[57] ABSTRACT

A power MOSFET device formed in a face of a semiconductor layer of a first conductivity type is provided. A first, second and third source region of a second conductivity type are formed in the face of the semiconductor layer within a moat and adjacent to its edges. A source conductor is insulatively disposed adjacent the face of the semiconductor layer and contacts the first, second and third source regions at a plurality of locations. A first and second drain region of a second conductivity type is also formed in the face of the semiconductor layer disposed spaced from and between the first and second source regions and the second and third source regions, respectively. A drain conductor is insulatively disposed adjacent the face of the semiconductor layer and contacts the first and second drain regions at a plurality of locations. A first and second field plate are insulatively disposed adjacent the face of the semiconductor layer and substantially adjacent and surrounding the first and second drain regions respectively. A first, second, third and fourth prongs forming gates of the device are insulatively disposed adjacent the face of the semiconductor layer and between the first field plate and the first and second source regions and between the second field plate and the second and third source regions. A portion of each of the gate prongs is disposed substantially above a portion of the first and second field plates. Conductive contacts connect the first and second field plates and the first and second drain regions.

21 Claims, 6 Drawing Sheets

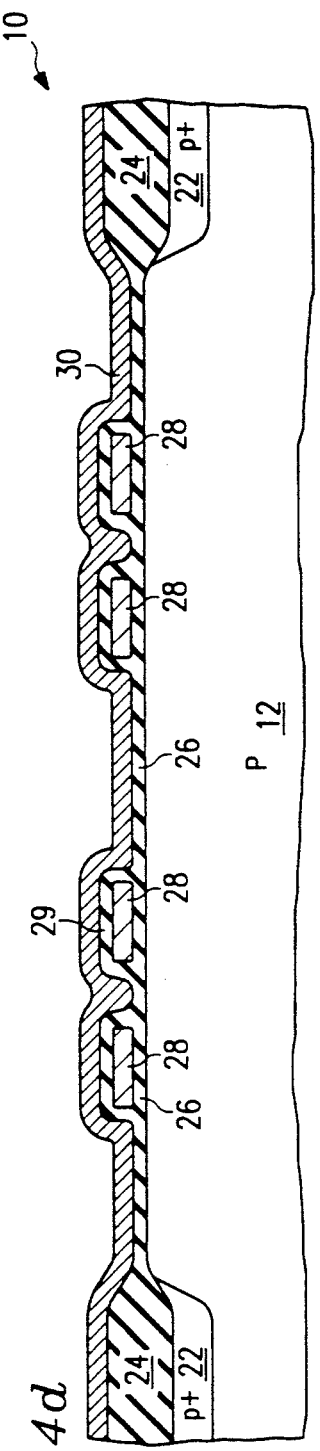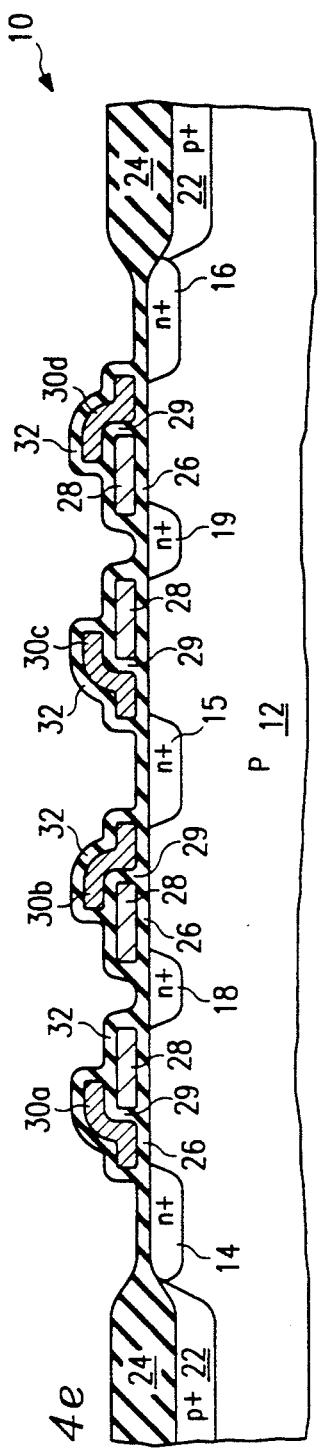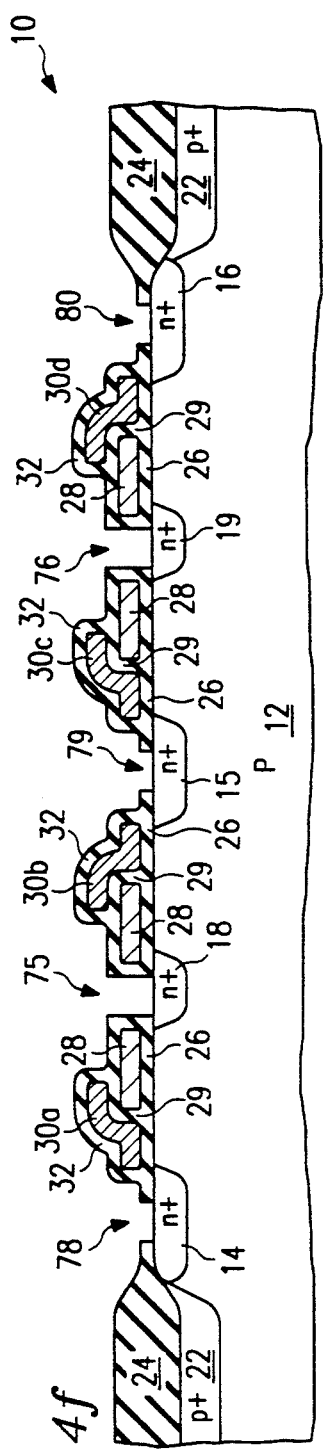

POWER MOSFET TRANSISTOR

This is a continuation of application Ser. No. 07/807,925, filed Dec. 16, 1991.

© *M* Texas Instruments Incorporated 1991. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

TECHNICAL FIELD OF THE INVENTION

This invention relates in general to the field of semiconductor devices and integrated circuits, and more particularly to a power MOSFET transistor.

BACKGROUND OF THE INVENTION

MOSFET transistors capable of handling high voltages have been used in power applications. Most power MOSFETs are of the DMOS (double diffused MOS) construction which inherently has a large drain-to-source parasitic capacitance. Power MOSFETs constructed by other processes may additionally have large gate-to-drain overlap capacitance. The large drain-to-source parasitic capacitance in effect increases the load capacitance, while the gate-to-drain overlap parasitic capacitance appears as an input capacitance augmented by the gain of the transistor. These parasitic capacitances adversely affect the transistor's performance when operating at high frequencies. Therefore, it is desirable to reduce the parasitic capacitances to improve the performance of a power MOSFET.

It is also beneficial to reduce or eliminate undesirable phenomena in a power transistor such as avalanche breakdown, hot electron stress, and punch-through to improve its performance. Conventional MOSFET transistors have the drain junction in direct contact with the p+ channel stop, therefore requiring a low doping concentration in the junction to maintain a high breakdown voltage. However, the lowered doping concentration also leads to an undesirable higher parasitic drain resistance. Some conventional MOSFET devices have the drain junction lying directly beneath the gate electrode, so that if the drain is biased at a large voltage, a drain induced tunneling current appears. This tunneling current may initiate an avalanche breakdown.

Hot electron stress is a phenomenon that may occur in a conventional MOSFET transistor under high current flow conditions. Hot holes generated in the pinch off region create traps in the oxide at the drain end of the channel. Electrons become caught in these traps and their accumulation induces stress in the gate oxide. The stress causes the transistor's performance to deteriorate, and in some instances, the stress is sufficient to cause destruction of the device.

Punch-through occurs with large drain biasing so that the drain depletion region grows to the point that the inverted channel vanishes. The result is a depletion region that extends from drain to source with carriers injected at the source driven to the drain by the high electrical field between the electrodes. Punch-through in effect adversely lowers the breakdown voltage of the device.

Accordingly, it is desirable to provide a MOSFET transistor which has reduced drain-to-source and gate-to-drain overlap capacitances that adversely affect the high frequency performance of the transistor. It is further desirable that the MOSFET transistor also has improved device parameters, such as breakdown voltage and threshold voltage, for improved high voltage and large current handling. Additionally, it is desirable to substantially reduce or eliminate the disadvantageous effects in the MOSFET transistor due to detrimental phenomena such as hot electron stress and punch-through.

SUMMARY OF THE INVENTION

In accordance with the present invention, a power MOSFET transistor is provided which substantially eliminates or reduces disadvantages and problems associated with prior devices.

In one aspect of the present invention, a field-effect device formed in a face of a semiconductor layer of a first conductivity type is provided. The boundaries of the device are defined by a moat and includes a first and second source region of a second conductivity type formed in the face of the semiconductor layer within the moat and adjacent to the edges thereof. A source conductor is insulatively disposed adjacent to the face of the semiconductor layer and connects the first and second source regions. A drain region of a second conductivity type is formed in the face of the semiconductor layer and disposed within the moat between the first and second source regions. Insulatively disposed adjacent the face of the semiconductor layer and substantially adjacent and surrounding the drain region is an annular field plate. A gate is further insulatively disposed between the field plate and the first and second source regions, where a portion of the gate substantially overlaps a portion of the field plate. The field plate is coupled to the drain region.

In another aspect of the present invention, a power MOSFET device formed in a face of a semiconductor layer of a first conductivity type is provided. Source regions of a second conductivity type are formed in the face of the semiconductor layer within a moat and adjacent to its edges. A source conductor is insulatively disposed adjacent the face of the semiconductor layer and contacts the source regions at a plurality of locations. Drain regions of a second conductivity type are also formed in the face of the semiconductor layer disposed spaced from and between the source regions. A drain conductor is insulatively disposed adjacent the face of the semiconductor layer and contacts the drain regions at a plurality of locations. Field plates are insulatively disposed adjacent the face of the semiconductor layer and substantially adjacent and surrounding the drain regions. Prongs forming gates of the device are insulatively disposed adjacent the face of the semiconductor layer and between the field plates and the source regions. A portion of each of the gate prongs is disposed substantially above a portion of the field plates. Conductive contacts connect the field plates and the drain regions.

An important technical advantage of the present invention is the advantageous structure that enables a reduction of parasitic capacitances in the transistor and thus improve the high frequency performance of the device.

Another important technical advantage of the present invention provides a transistor structure which contributes to a reduction or elimination of the occurrence of undesirable operating phenomena such as avalanche breakdown, hot electron stress and punch-through.

A further important technical advantage of the present invention provides a power MOSFET transistor which has the above desirable traits and yet may be manufactured by conventional semiconductor fabrication processes.

BRIEF DESCRIPTION OF THE DRAWINGS

For a better understanding of the present invention, reference may be made to the accompanying drawings, in which:

FIGS. 4a–4g are greatly enlarged schematic elevational cross-sectional views of a semiconductor layer showing progressive stages in the fabrication of the preferred embodiment of the power MOSFET transistor according to the invention;

DETAILED DESCRIPTION OF THE INVENTION

Figure 1:
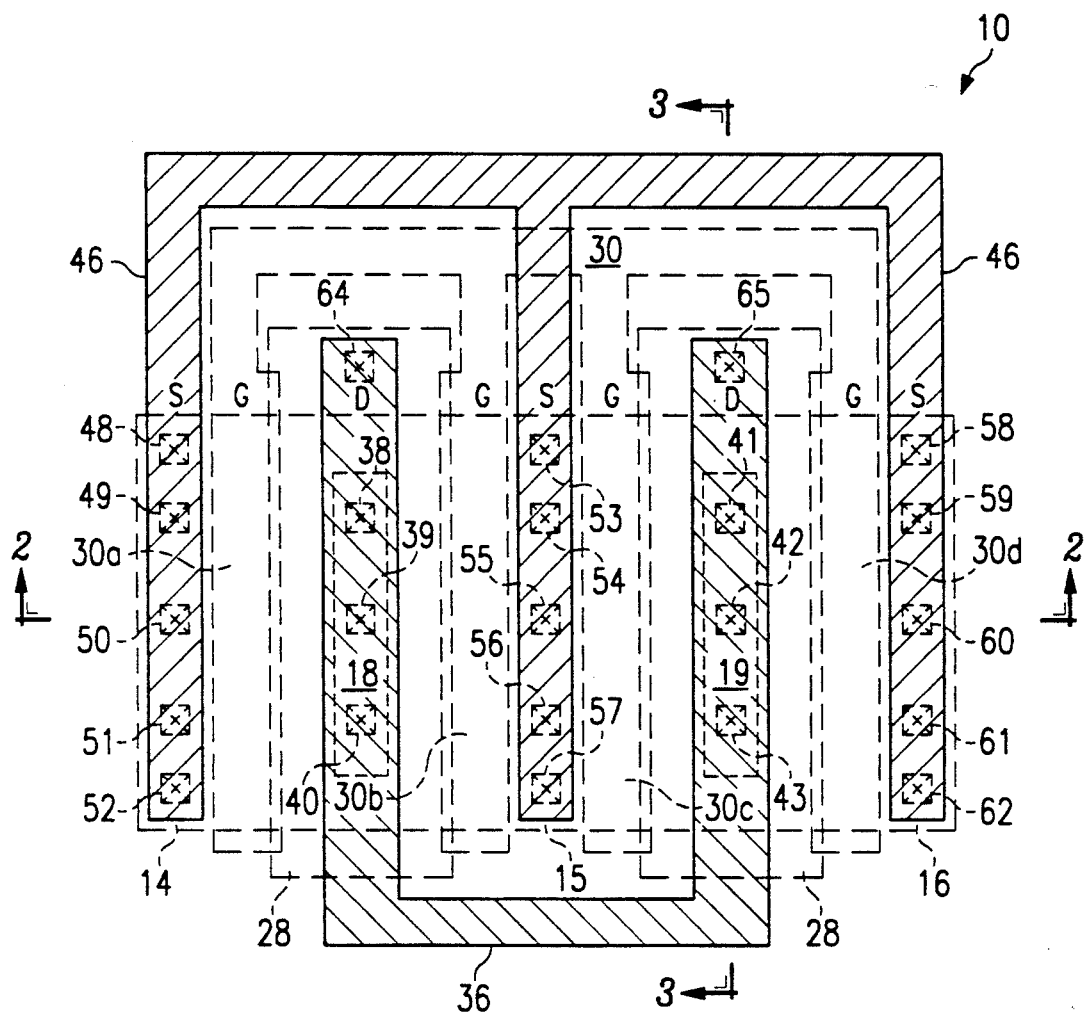
FIG. 1 is a plan view of a preferred embodiment of the power MOSFET transistor constructed in accordance with the present invention.

With reference to the drawings, FIG. 1 illustrates a greatly enlarged plan view of a power MOSFET transistor structure, indicated generally at 10 and constructed according to the teaching of the present invention. References are also made concurrently to FIGS. 2 and 3, which are cross-sectional views of transistor structure 10 along lines 2—2 and 3—3, respectively. Transistor structure 10 shown is an n-channel device built on a p-type substrate 12 with n+ source regions 14–16 and drain regions 18–19. A moat is defined by a p+ channel stop region 22 disposed around the n+ source and drain regions 14–16 and 18–19. The spacing between n+ drain regions 18-19 and channel stop 22, shown as $S_{dch}$, in FIG. 3, must be adequate to achieve the desired drain breakdown voltage $V_{bdss}$ as described below. A thick field oxide layer 24 lies directly on top of p+ channel stop region 22. Within the moat formed by channel stop 22, a thin oxide layer 26 lies directly adjacent the top surface of p-type substrate 12. Disposed directly on top of thin oxide layer 26 is a field plate structure formed by a first polycrystalline silicon layer or poly-1 layer 28. The field plate structure 28 in effect consists of rectangular annular regions around each of n+ drain regions 18 and 19, where the outer edges of n+ drain regions 18 and 19 are in alignment with the inner edges of field plates 28.

Figure 2:
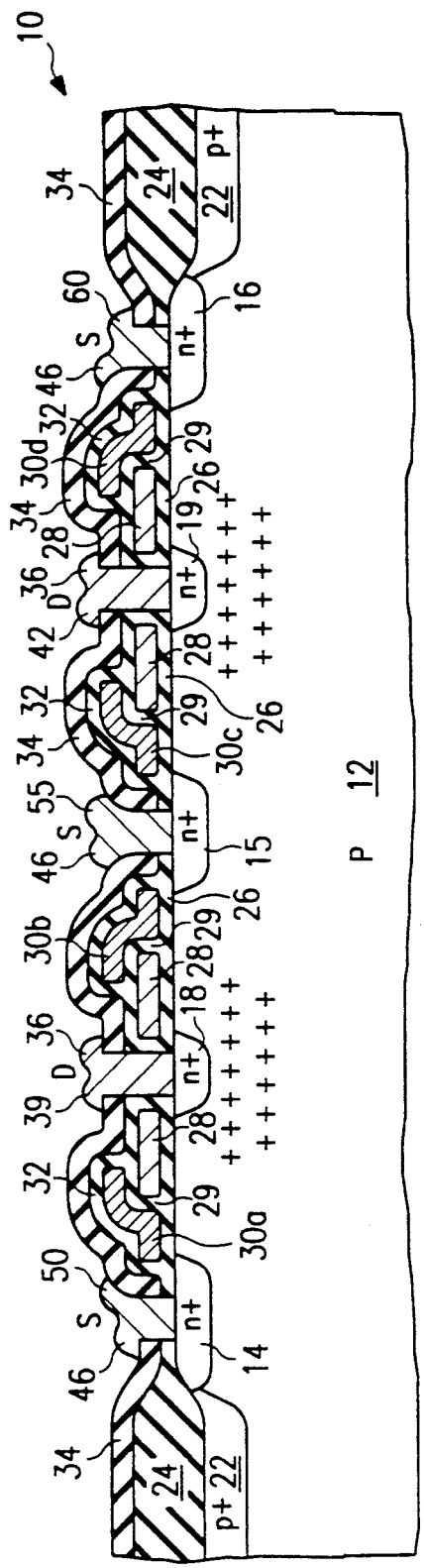
FIG. 2 is a greatly enlarged schematic elevational cross-sectional view of the preferred embodiment of the power MOSFET transistor taken substantially along line 2—2 of FIG. 1.
Figure 3:
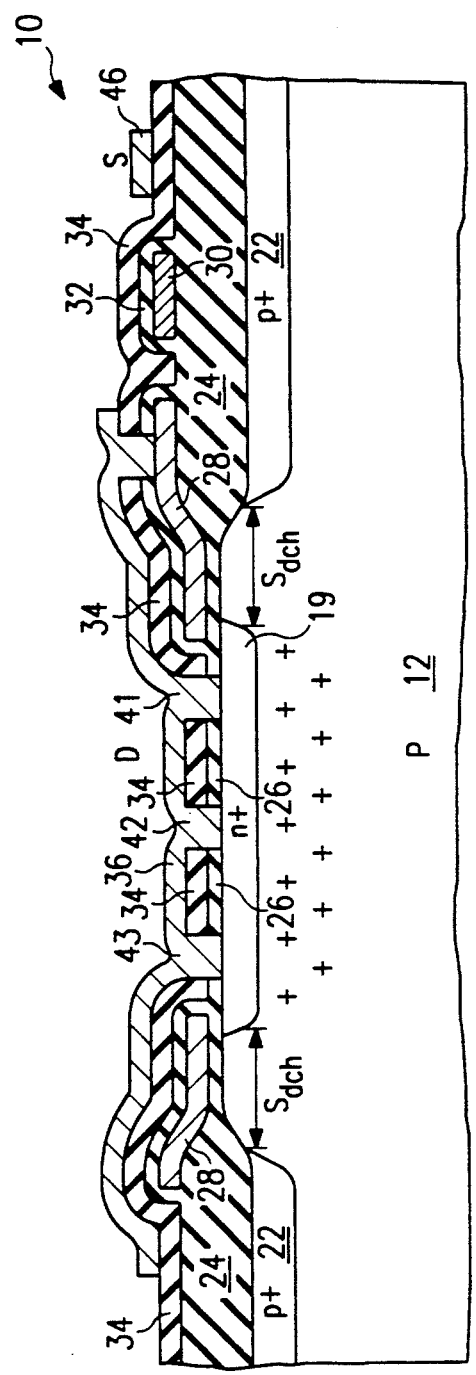
FIG. 3 is a greatly enlarged schematic elevational cross-sectional view of the preferred embodiment of the power MOSFET transistor taken substantially along line 3—3 of FIG. 1.

Another layer of insulator or oxide 29 lies directly on top of field plate structure 28. A second polycrystalline silicon layer or poly-2 layer 30 forming a four-tinned fork, as best seen in plan view FIG. 1, where each tine 30a–d is disposed between source and drain n+ regions 14–16 and 18–19, is disposed on top of oxide layer 29. Poly-2 layer 30 forms the gate electrode of transistor structure 10. As best seen in FIGS. 1 and 2, there is a slight overlap between poly-1 and poly-2 regions 28 and 30. An insulating oxide layer 32 lies directly on top of poly-2 layer or gate 30, on top of which another layer of insulating oxide 34 is formed. A metal line 36 and contacts 38–43 connect n+ drain regions 18 and 19. A second metal line 46 and contacts 48–62 connect n+ source regions 14–16. Additional contacts 64 and 65 connect n+ drain regions 18 and 19 with poly-1 field plates 28. Optionally, n-type ions may be implanted under n+ drain regions 18 and 19, as shown in FIGS. 2 and 3.

As seen in FIG. 1, transistor structure 10 is formed by metal line prongs 46 interleaved with metal line prongs 36 in a regular fashion. Gate electrodes 30 are also formed in a prong-like manner where each prong lies between the drain and source junctions of the device. Accordingly, transistor structure 10 may be expanded easily by extending metal lines 46 and 36 and gate electrode 30 in a horizontal manner and repeating the pattern seen in FIG. 1.

Figure 4A:
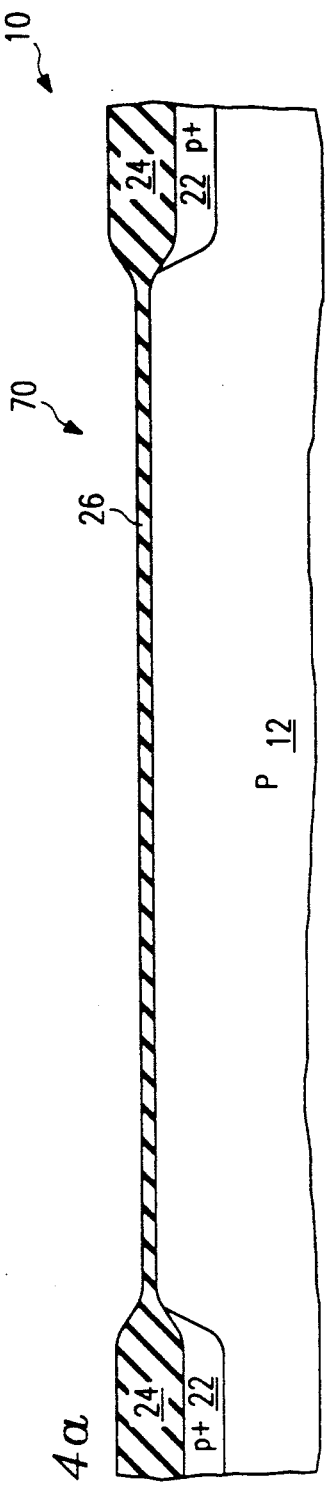

Referring to FIGS. 4a–4g, progressive cross-sectional views of the semiconductor layer during fabrication of transistor structure 10 of the present invention are shown. Because a conventional two-poly fabrication process method known in the art may be used to fabricate transistor structure 10, the fabrication steps are briefly described below. FIG. 4a shows the structural layers after the following fabrication steps have been performed. A moat 70 is defined on the surface of a p-type substrate 12 by first growing an oxide layer 26 on the surface of substrate 12, and then depositing a nitride layer (not shown). The nitride layer is etched by conventional methods leaving portions of oxide layer 26, where field oxide is intended to occupy, exposed. P-type ions, typically boron, are then preferably implanted to form channel stop region 22. A thick oxide region is then preferably grown to form field oxide 24. The nitride layer (not shown) is then removed by conventional means. Although not shown or required, conventional threshold voltage adjusting steps may be performed at this juncture.

Figure 4B:
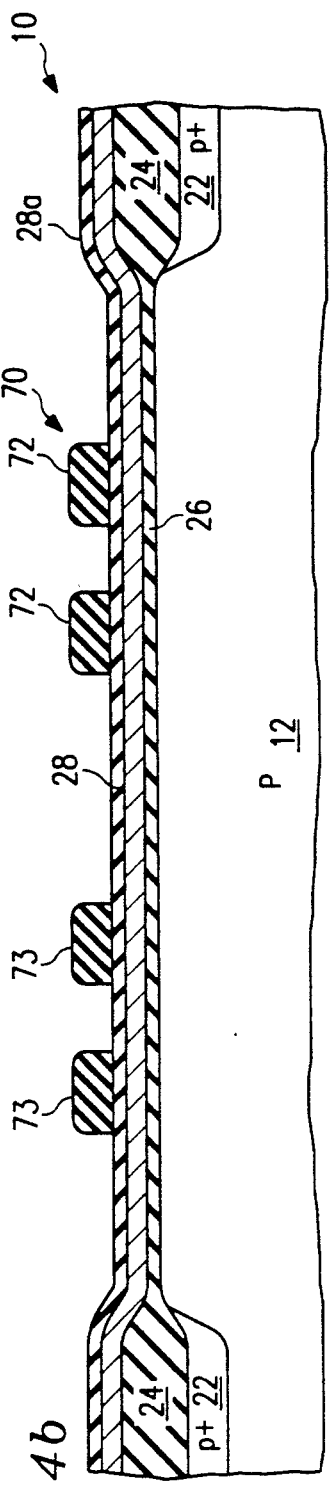
Figure 4C:
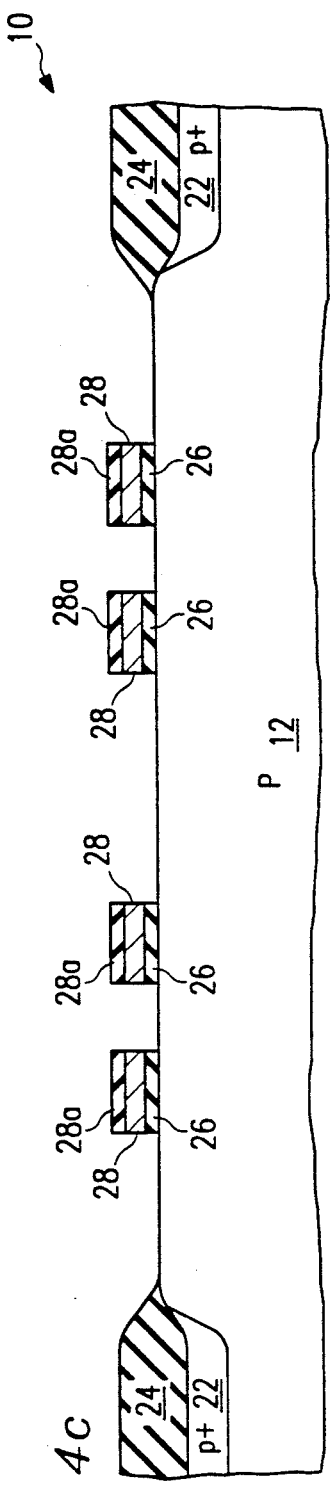

Referring to FIG. 4b, poly-1 layer 28 has been formed on top of gate oxide layer 26 and an oxide layer 28a has been disposed on top of poly-1 layer 28. Patterned photoresists 72 and 73 have been positioned on oxide layer 28a to pattern etch poly-1 layer 28 and oxide layer 28a. FIG. 4c shows transistor structure 10 after poly-1 layer 28, oxide layer 28a and gate oxide etching steps.

Referring to FIG. 4d, an insulating oxide layer 29 of proper thickness is formed on top of oxide layer 28a and a second poly or poly-2 layer 30 is deposited on top of oxide layer 29 (oxide layer 28a has been omitted in the following figures to avoid unnecessary cluttering of the schematic views). The combined thickness of oxide layer 28a and oxide layer 29 is preferably 500–600Å. The additional oxide thickness on top of poly-1 layer 28 lessens the "corner effect" at the substantially sharp corner of poly-1 layer 28 to effectively raise the breakdown voltage. Alternatively, sidewall oxide processes known in the art may be used to achieve the desired oxide thickness between poly-1 and poly-2 layers 28 and 30, approximate thickness of about 500–1000Å.

Referring to FIG. 4e, poly-2 layer 30 is pattern etched to form a slight overlap over poly-1 layer 28 in predefined locations and followed by a gate oxide etch step. An oxide layer 32 is then grown over the face of the semiconductor. Drain and source n+ regions 18–19 and 14–16 may then be formed at selected locations by an implantation and diffusion process of arsenic ions. This results in the source-drain diffusion regions being self-aligned to the poly-1 and poly-2 layers 28 and 30.

Figure 4G:
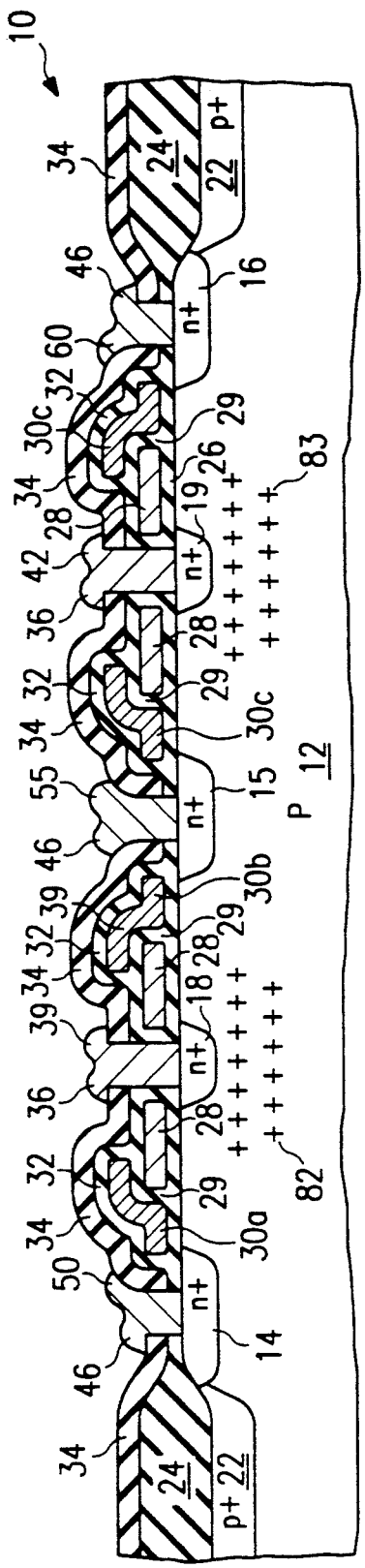

In FIG. 4f, contact openings 75–76 and 78–80 in oxide layer 32 are formed to expose drain and source n+ regions 18–19 and 14–16, respectively. Referring to FIG. 4g, another oxide layer 34 is formed and etched by conventional methods to expose contact openings 75–76 and 78–80 of FIG. 4f. A patterned metal line 36 is then deposited to form contacts 38–43 (FIG. 1) and connect drain regions 18–19, and another patterned metal line 46 is deposited to form contacts 48–62 (FIG. 1) and connect source regions 14–16. Subsequently, conventional process steps to form a protective overcoat (not shown) over the semiconductor face may be performed. FIG. 4g further shows n-type ions 82 and 83 implanted beneath drain n+regions 18 and 19, respectively. The implantation of ions 82 and 83 is an optional step which may be performed at an appropriate juncture during the fabrication process, and may serve to reduce the drain resistance of the device.

It is important to note that the fabrication process described above may be a conventional two-poly process as known in the art and that conventional process parameters, such as doping concentrations, dopant compositions, oxidization temperatures and durations, deposition and etching methods, and layer thicknesses except otherwise specified, are conventional and known in the art of semiconductor device fabrication, and are therefore not described and enumerated in detail herein.

Figure 5:
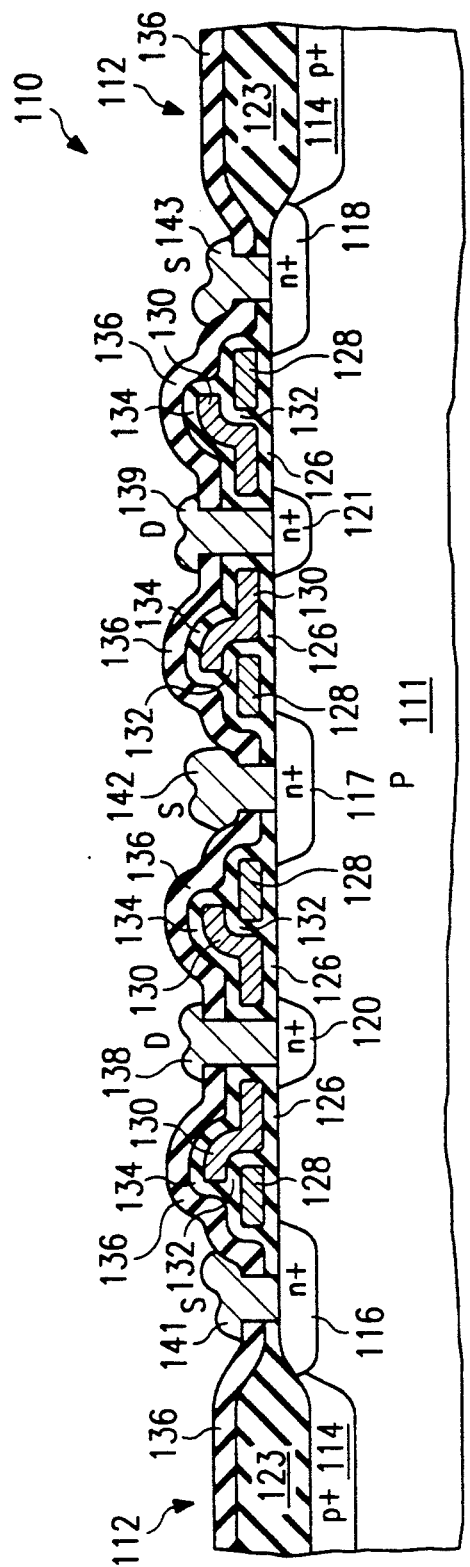
FIG. 5 is a greatly enlarged schematic elevational cross-sectional view of the preferred second embodiment of the power MOSFET taken substantially along line 3—3 of FIG. 1.

Referring to FIG. 5, an alternate embodiment of the present power MOSFET transistor device, indicated generally at 110, is shown built on a p-type substrate 111. Similar to the view of transistor structure 10 shown in FIG. 2, a moat 112 is also defined by a p+ channel stop region 114 disposed around n+ source and drain regions 116–118 and 120–121, respectively. A thick field oxide layer 123 lies directly above p+ channel stop region 114. Within moat 112, a thin oxide layer 126 lies atop p-type substrate 111. Disposed on top of thin oxide layer 126 is a patterned poly-1 layer 128. A patterned poly-2 layer 130 is disposed above poly-1 layer 128 and separated therefrom by another insulator or oxide layer 132. Insulating oxide layers 134 and 136 are further disposed on top of poly-2 layer 130. Similarly constructed as that of transistor structure 10, metal lines (not shown) and metal contacts 138–139 are formed to connect n+ drain regions 120–121, and metal lines (not shown) and metal contacts 141–143 are formed to connect n+ source regions 116–118. Additionally, contacts similar to contacts 64–65 (FIG. 1) of transistor structure 10 are also formed to connect n+ drain regions 120–121 with poly-1 layers 130.

It can be seen that transistor structure 110 differs from transistor structure 10 in FIG. 2 in the configuration and orientation of poly-1 and poly-2 layers 128 and 130. In transistor structure 110, poly-1 layer 128 forms the gate electrode and poly-2 layer 130 forms the field plate structure of the device. As shown, a portion of field plate structure 130 overlaps gate electrode 128.

Unlike transistor structure 10, the length of poly-1 gate electrode 128 is relatively fixed. In transistor structure 10, a shifting or misalignment of poly-2 gate electrodes 30a–d with respect to source diffusion regions 14–16, would result in a decrease or increase in the lengths of poly-2 gate electrodes 30a and 30c on one side of drain electrodes 39 and 42, and a corresponding increase or decrease in the widths of poly-2 gate electrodes 30b and 30d. For example, if poly-2 gate electrodes 30a and 30b are shifted right, as viewed in FIG. 2, relative to poly-1 field plates 28, the resulting device would have a shorter gate electrode 30a and a longer gate electrode 30b. The shorter and longer gate electrodes 30a and 30b would cause a greater current flow from n+ source region 14 to n+ drain region 18 than the current flow from n+ source region 15 to n+ drain region 18. Thus non-uniform power dissipation or a hot spot is created within the device which could reduce the reliability of the device.

On the other hand, a shifting or misalignment of poly-2 field plates 130 of transistor structure 110 would not alter the lengths of poly-1 gate electrodes 128, and thus would not cause unequal current flow on the left and right hand sides of drain junctions 120 and 121. Therefore, if accurate alignment cannot be ensured in semiconductor processing, transistor structure 110 is preferable over transistor structure 10 to increase the reliability of the device.

Figure 6:
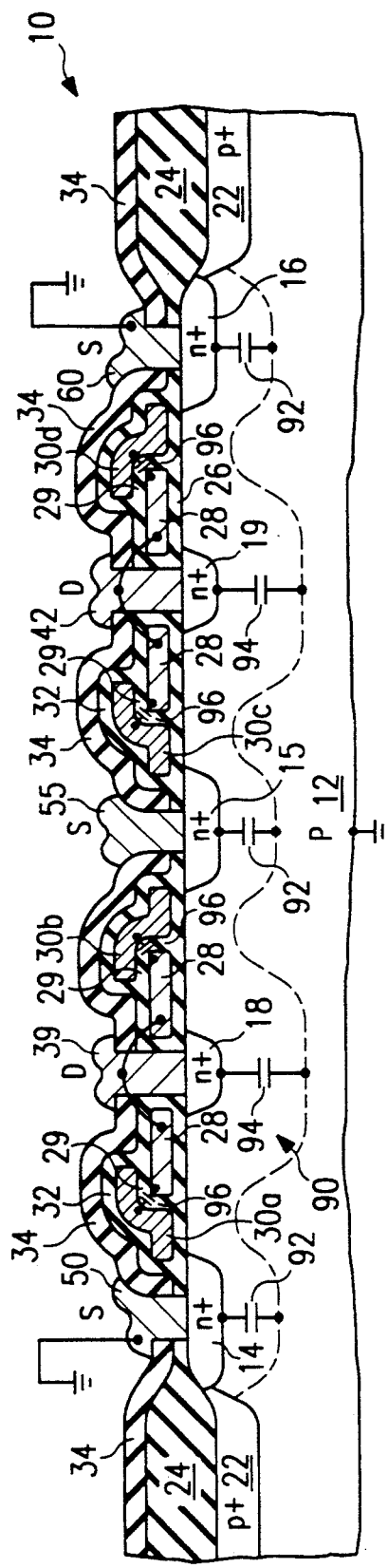
FIGS. 6 and 7 are schematic elevational cross-sectional views of the preferred embodiment of power MOSFET transistor taken substantially along line 2—2 of FIG. 1 and showing the various electrical parameters of the device during operation.
Figure 7:
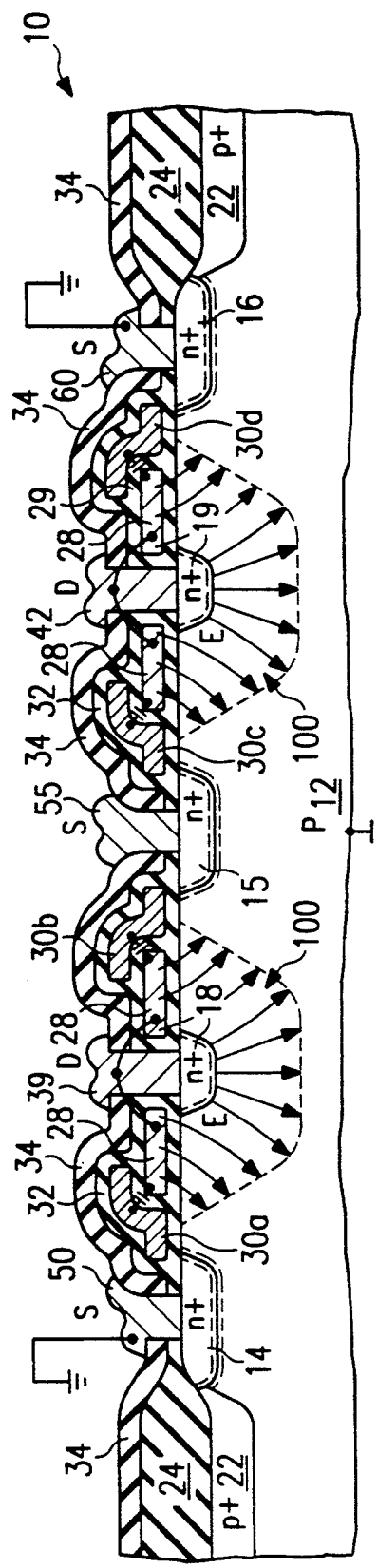

There are several advantageous structural features of transistor structures 10 and 110 worth special recognition. For ease of explanation, the following makes references to transistor structure 10 only, but is applicable to both transistor structures 10 and 110. Undesirable parasitic drain-to-source and gate-to-drain overlap capacitances are reduced in transistor structure 10. Referring to FIGS. 6 and 7 showing cross-sectional views along line 2—2 of FIG. 1, source contacts or electrodes 50, 55 and 60 of transistor structure 10 are symbolically shown coupled to ground as well as substrate 12. Drain electrodes 39 and 42 are shown tied to poly-1 field plate 28 symbolically to serve as a reminder that they are at approximately the same voltage level. A depletion region 90, the outline of which is substantially shown in phantom, is formed under drain and source n+ regions 18–19 and 14–16. Parasitic capacitances, such as source-to-bulk capacitances $C_{sb}$ 92, drain-to-bulk capacitances $C_{db}$ 94, and gate-to-drain capacitances $C_{gd}$ 96, and their general locations within transistor structure 10 are illustrated. The drain capacitances are reduced due to the wide depletion region around the drain in the present structure. In addition, by providing a relatively thick sidewall oxide layer between the edges of poly-1 and poly-2 layers 28 and 30 and a thicker oxide layer on top of poly-1 layer 28, the gate-to-drain parasitic capacitance is lowered at the same time the breakdown voltage between them is raised.

In the preferred embodiment of the present invention, n+ drain regions 18 and 19 are kept spaced from p+ channel stop 22 by the field plate formed by poly-1 layer 28 that creates a spacing $S_{dch}$ (FIG. 3) rather than positioning drain regions adjacent to the channel stops. The $S_{dch}$ spacing is crucial in increasing the breakdown voltage $V_{bdss}$ of the device. Referring to FIG. 7, where electric field lines 100 around the drain junction are shown. It can be seen that field plate 28 acts to spread out electric field lines 100 and lessen the intensity of the electric field. As a result, the breakdown voltage $V_{bdss}$ of transistor structure 10 is increased. In conventional power MOSFET transistors, the drain junction may be in direct contact with the channel stop, making it necessary to maintain the doping concentration of the junction low in order to preserve a high breakdown voltage $V_{bdss}$. However, because the parasitic drain resistance is inversely proportional to the doping concentration of the junction, a relatively high parasitic drain resistance results from this obviously undesirable trade-off.

Furthermore, in transistor structure 10 of the present invention, the drain junction does not lie directly under the gate electrode or poly-2 layer 30, but is tied to poly-1 field plate 28. More specifically, the surface potential induced by the poly-1 field plate 28 is approximately equal to the drain bias voltage $V_d$ less the threshold voltage $V_T$, or $(V_d-V_T)$. By maintaining the drain junction and poly-1 field plate 28 voltages substantially the same, the occurrence of avalanche multiplication induced by drain tunneling current may be reduced or eliminated.

Additionally, because of the low electric field at the drain end of the channel and under the edge of poly-1 layer 28, but not over the drain junction, the possibility of hot electron stress occurring may be reduced or eliminated. It is known in the art that hot electron stress affects the performance of the transistor device by degrading the mobility of the electrons and the transconductance of the device, which results in the device's poor current handling capacity, and eventually can lead to the destruction of the device.

The threat of punch-through is also diminished in transistor structure 10 of the present invention since most of the drain depletion region lies under poly-1 field plate 28. In conventional transistor devices, additional ion implants are used to prevent punch-through, which has the undesirable effect of raising the threshold voltage, such devices with high threshold voltages cannot be used in certain applications where the gate bias voltage is five volts. The transistor structure 10 may be fabricated with a low threshold voltage of approximately 1.0 volts.

Although the present invention has been described in detail, it should be understood that various changes, substitutions and alterations can be made thereto without departing from the spirit and scope of the present invention as defined by the appended claims.

What is claimed is:

1. A field-effect device formed in a face of a semiconductor layer of a first conductivity type comprising:
   a moat region formed in said face, said moat region defined by and enclosed within a field insulating region, said moat region having four edges;
   a channel stop region formed beneath said field insulating region;
   a first and second source region of a second conductivity type formed in said face of said semiconductor layer within said moat, said first source region adjacent said first edge and said second source region adjacent said third edge;
   a drain region of said second conductivity type formed in said face of said semiconductor layer and disposed between said first and second source regions, said drain region spaced from said second edge of said moat region by a region of said first conductivity type, said second edge abutting said first edge and also abutting said third edge;
   a field plate insulatively disposed adjacent said face of said semiconductor layer and substantially adjacent and surrounding said drain region;
   a gate insulatively disposed adjacent said face of said semiconductor layer and between said field plate and said first and second source regions; and
   a contact coupling said field plate and said drain region.

2. The device, as set forth in claim 1, wherein said field plate is annular and inner edges thereof are substantially aligned with boundaries of said drain region.

3. The device, as set forth in claim 1, wherein said gate having a predetermined insulative spacing from said field plate.

4. The device, as set forth in claim 1, further comprising a region of impurities of said second conductivity type formed substantially below said drain region and field plate.

5. The device, as set forth in claim 1, wherein a portion of said gate is further disposed substantially above a portion of said field plate.

6. The device, as set forth in claim 1, wherein a portion of said field plate is further disposed substantially above a portion of said gate.

7. The device, as set forth in claim 1, further comprising:
   a third source region of said second conductivity type formed in said face of said semiconductor layer within said moat, said third source region disposed between said drain and said second source region;
   a second drain region of a second conductivity type formed in said face of said semiconductor layer and disposed between said second and third source regions;
   a second field plate insulatively disposed adjacent said face of said semiconductor layer and substantially adjacent and surrounding said second drain region;
   a second gate insulatively disposed adjacent said face of said semiconductor layer, and between said second field plate and said second and third source regions, and said second gate being coupled to said first gate; and
   a contact coupling said second field plate and said second drain region.

8. The device, as set forth in claim 7, further comprising:
   a first set of conductive lines insulatively disposed adjacent said face of said semiconductor layer substantially above said source regions, said lines being coupled together;
   a first plurality of contacts connecting said first set of conductive lines to said first, second and third source regions;
   a second set of conductive lines insulatively disposed adjacent said face of said semiconductor layer substantially above said first and second drain regions, said lines being coupled together; and
   a second plurality of contacts connecting said second set of conductive lines to said first and second drain regions and said first and second field plates.

9. The device, as set forth in claim 7, wherein said second field plate is annular and inner edges thereof are substantially aligned with boundaries of said second drain region.

10. The device, as set forth in claim 7, wherein said second drain region is spaced from said second edge of said moat by a region of said first conductivity type.

11. The device, as set forth in claim 7, wherein said second gate having a predetermined insulative spacing from said second field plate.

12. The device, as set forth in claim 7, further comprising a region of impurities of said second conductivity type formed in said semiconductor layer substantially below said second drain region and second field plate.

13. The device, as set forth in claim 7, wherein a portion of said second gate is disposed substantially above a portion of said second field plate.

14. The device, as set forth in claim 7, wherein a portion of said second field plate is disposed substantially above a portion of said second gate.

15. The device of claim 1 wherein said first source region abuts said second and fourth edges of said moat and said second source region abuts said second and fourth edges of said moat.

16. The device of claim 1 and further comprising a source conductor insulatively disposed adjacent said face or said semiconductor layer and coupling said first and second source regions.

17. The device of claim 1 wherein a portion of said gate substantially overlaps a portion of said field plate.

18. The device of claim 1 wherein semiconductor layer of a first conductivity type comprises p-doped silicon.

19. A transistor device comprising:
a semiconductor layer of a first conductivity type;
a field insulating region formed in said layer, said field insulating region fully enclosing a moat region, said moat region having first and third substantially parallel edges and second and fourth substantially parallel edges;
a first source region formed in said semiconductor layer and abutting said first, second and fourth edges of said moat region;
a first drain region formed in said semiconductor layer and spaced from second and fourth edges of said moat region by said semiconductor layer, said first drain region spaced from said first source region by a first channel region;
a second source region formed in said semiconductor layer and abutting said second and fourth edges of said moat region, said second source region spaced from said first drain region by a second channel region;
a second drain region formed in said semiconductor layer and spaced from second and fourth edges of said moat region by said semiconductor layer, said second drain region spaced from said second source region by a third channel region;
a third source region formed in said semiconductor layer and abutting said second, third and fourth edges of said moat region, said third source region spaced from said second drain region by a fourth channel region;
a first field plate formed over said semiconductor layer and insulated therefrom, said first field plate substantially adjacent and surrounding said first drain region;
a second field plate formed over said semiconductor layer and insulated therefrom, said second field plate substantially adjacent and surrounding said second drain region;
a source conductor formed over said semiconductor layer and insulated therefrom, said source conductor electrically coupling said first, second and third source regions;
a drain conductor formed over said semiconductor layer and insulated therefrom, said drain conductor electrically coupling said first and second drain regions and said first and second field plates; and
a gate region formed over each of said channel regions and insulated therefrom.

20. The device of claim 19 and further comprising a channel stop region formed beneath said field insulating region.

21. The device of claim 19 and further comprising a region of impurities formed in said semiconductor layer beneath said drain region.

* * * * *